(12) United States Patent
Yu et al.

(10) Patent No.: US 10,777,504 B2
(45) Date of Patent: Sep. 15, 2020

(54) INTERCONNECT STRUCTURE FOR SEMICONDUCTOR DEVICE AND METHODS OF FABRICATION THEREOF

(71) Applicant: Taiwan Semiconductor Manufacturing Co., Ltd., Hsinchu (TW)

(72) Inventors: Chia-Ta Yu, New Taipei (TW); Kai-Hsuan Lee, Hsinchu (TW); Yen-Ming Chen, Hsin-Chu County (TW); Chi On Chui, Hsinchu (TW); Sai-Hooi Yeong, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/048,957

(22) Filed: Jul. 30, 2018

(65) Prior Publication Data

US 2019/0067197 A1 Feb. 28, 2019

Related U.S. Application Data

(62) Division of application No. 15/692,439, filed on Aug. 31, 2017, now Pat. No. 10,515,896.

(51) Int. Cl.
*H01L 23/528* (2006.01)
*H01L 21/3105* (2006.01)
(Continued)

(52) U.S. Cl.
CPC ........ *H01L 23/5283* (2013.01); *C23C 14/021* (2013.01); *C23C 14/04* (2013.01);
(Continued)

(58) Field of Classification Search
CPC ......... H01L 21/76843; H01L 21/76802; H01L 21/7684; H01L 21/76883; H01L 21/76879;
(Continued)

(56) References Cited

U.S. PATENT DOCUMENTS 4,968,641 A 11/1990 Kalnitsky et al.
5,330,936 A 7/1994 Ishitani et al.
(Continued)

FOREIGN PATENT DOCUMENTS

KR 20020070099 9/2002
KR 20160064074 6/2016
(Continued)

OTHER PUBLICATIONS

Ande et al., Role of Surface Termination in Atomic Layer Deposition of Silicon Nitride, J. Phys. Chem. Lett. 2015, 6, 3610-3614.

*Primary Examiner* — Sophia T Nguyen
(74) *Attorney, Agent, or Firm* — Haynes and Boone, LLP

(57) ABSTRACT

Methods and devices for forming a conductive line disposed over a substrate. A first dielectric layer is disposed over the substrate and coplanar with the conductive line. A second dielectric layer disposed over the conductive line and a third dielectric layer disposed over the first dielectric layer. A via extends through the second dielectric layer and is coupled to the conductive line. The second dielectric layer and the third dielectric layer are coplanar and the second and third dielectric layers have a different composition. In some embodiments, the second dielectric layer is selectively deposited on the conductive line.

19 Claims, 12 Drawing Sheets

(51) Int. Cl.
| | |
|---|---|
| *H01L 21/768* | (2006.01) |
| *H01L 23/522* | (2006.01) |
| *H01L 23/532* | (2006.01) |
| *C23C 14/02* | (2006.01) |
| *C23C 14/04* | (2006.01) |
| *C23C 14/06* | (2006.01) |
| *C23C 16/02* | (2006.01) |
| *C23C 16/04* | (2006.01) |
| *C23C 16/34* | (2006.01) |
| *H01L 21/02* | (2006.01) |
| *H01L 21/32* | (2006.01) |

(52) U.S. Cl.
CPC ...... *C23C 14/0652* (2013.01); *C23C 16/0227* (2013.01); *C23C 16/04* (2013.01); *C23C 16/345* (2013.01); *H01L 21/0217* (2013.01); *H01L 21/02126* (2013.01); *H01L 21/02129* (2013.01); *H01L 21/02131* (2013.01); *H01L 21/02307* (2013.01); *H01L 21/02312* (2013.01); *H01L 21/02321* (2013.01); *H01L 21/02337* (2013.01); *H01L 21/02343* (2013.01); *H01L 21/02359* (2013.01); *H01L 21/02362* (2013.01); *H01L 21/3105* (2013.01); *H01L 21/7684* (2013.01); *H01L 21/76802* (2013.01); *H01L 21/76819* (2013.01); *H01L 21/76826* (2013.01); *H01L 21/76835* (2013.01); *H01L 21/76843* (2013.01); *H01L 21/76879* (2013.01); *H01L 21/76883* (2013.01); *H01L 23/5226* (2013.01); *H01L 23/53295* (2013.01); *H01L 21/32* (2013.01)

(58) Field of Classification Search
CPC ........... H01L 21/76829; H01L 23/5226; H01L 23/5283
See application file for complete search history.

(56) References Cited

U.S. PATENT DOCUMENTS

| | | | |
|---|---|---|---|
| 5,888,897 A | 3/1999 | Liang et al. | |
| 6,528,409 B1* | 3/2003 | Lopatin | H01L 21/288 257/E21.174 |
| 6,531,410 B2 | 3/2003 | Bertin et al. | |
| 7,045,875 B2 | 5/2006 | Kim et al. | |
| 7,078,313 B2 | 7/2006 | Kirchhoff et al. | |
| 7,109,089 B2 | 9/2006 | Torek et al. | |
| 7,115,492 B2 | 10/2006 | Pan et al. | |
| 7,176,119 B2 | 2/2007 | Gambino et al. | |
| 7,307,324 B2 | 12/2007 | Uchiyama et al. | |
| 7,902,613 B1* | 3/2011 | Pierrat | H01L 21/76807 257/296 |
| 7,983,092 B2 | 7/2011 | Chang et al. | |
| 8,039,964 B2 | 10/2011 | Farooq et al. | |
| 8,269,208 B2 | 9/2012 | Czubatyj et al. | |
| 8,298,628 B2 | 10/2012 | Yang et al. | |
| 8,344,348 B2 | 1/2013 | Wicker et al. | |
| 8,592,005 B2 | 11/2013 | Ueda et al. | |
| 8,772,109 B2 | 7/2014 | Colinge | |
| 8,785,262 B2 | 7/2014 | Farmer et al. | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,660,148 B2 | 10/2014 | Hu et al. | |
| 8,896,068 B2 | 11/2014 | Mayuzumi et al. | |
| 8,900,989 B2 | 12/2014 | Tsai et al. | |
| 8,901,553 B2 | 12/2014 | Inoue et al. | |
| 8,999,492 B2 | 4/2015 | Millward et al. | |
| 9,105,490 B2 | 8/2015 | Wang | |
| 9,142,505 B2 | 9/2015 | Yang et al. | |
| 9,236,267 B2 | 1/2016 | De et al. | |
| 9,236,300 B2 | 1/2016 | Liaw | |
| 9,236,437 B2 | 1/2016 | Zaleski et al. | |
| 9,343,356 B2 | 5/2016 | Kuo et al. | |
| 9,353,479 B2 | 5/2016 | Baluha | |
| 9,373,543 B1* | 6/2016 | Mont | H01L 21/76808 |
| 9,378,976 B2 | 6/2016 | Shaviv et al. | |
| 9,406,555 B2 | 8/2016 | Deng et al. | |
| 9,461,143 B2 | 10/2016 | Pethe et al. | |
| 9,466,525 B2* | 10/2016 | Peng | H01L 23/53238 |
| 9,520,321 B2 | 12/2016 | Ryan et al. | |
| 9,520,482 B1 | 12/2016 | Chang et al. | |
| 9,530,691 B1 | 12/2016 | Zhang et al. | |
| 9,576,814 B2 | 2/2017 | Wu et al. | |
| 9,633,948 B2* | 4/2017 | Brink | H01L 21/76802 |
| 9,653,356 B2 | 5/2017 | Park et al. | |
| 9,748,169 B1 | 8/2017 | Murray et al. | |
| 9,793,163 B2 | 10/2017 | Bristol et al. | |
| 9,887,160 B2 | 2/2018 | Spooner et al. | |
| 9,911,595 B1 | 3/2018 | Smith et al. | |
| 9,960,110 B2 | 5/2018 | Boyanov et al. | |
| 10,181,421 B1* | 1/2019 | Ryan | H01L 21/76897 |
| 10,366,903 B2 | 7/2019 | Lin et al. | |
| 2003/0089987 A1* | 5/2003 | Parikh | H01L 21/7681 257/758 |
| 2004/0018714 A1* | 1/2004 | Cooney, III | H01L 21/76811 438/618 |
| 2004/0061197 A1 | 4/2004 | Block et al. | |
| 2005/0224797 A1 | 10/2005 | Ko et al. | |
| 2006/0160350 A1* | 7/2006 | Bruley | H01L 21/76829 438/618 |
| 2006/0231956 A1 | 10/2006 | Kawabata et al. | |
| 2007/0249156 A1* | 10/2007 | Bonilla | H01L 21/02074 438/622 |
| 2008/0197499 A1 | 8/2008 | Yang et al. | |
| 2009/0176368 A1 | 7/2009 | Wu et al. | |
| 2009/0233236 A1* | 9/2009 | Black | B82Y 10/00 430/311 |
| 2010/0038625 A1* | 2/2010 | Bertin | B82Y 10/00 257/9 |
| 2010/0055903 A1* | 3/2010 | Werner | H01L 21/02164 438/675 |
| 2010/0221911 A1* | 9/2010 | Aubel | H01L 21/02063 438/643 |
| 2013/0105996 A1* | 5/2013 | Brink | H01L 21/76802 257/786 |
| 2013/0328208 A1 | 12/2013 | Holmes et al. | |
| 2014/0104938 A1* | 4/2014 | Castro | G11C 13/0004 365/163 |
| 2014/0199832 A1* | 7/2014 | Nguyen | H01L 21/02244 438/637 |
| 2014/0210040 A1* | 7/2014 | Filippi | H01L 23/53295 257/529 |
| 2014/0217612 A1* | 8/2014 | Bao | H01L 23/5256 257/775 |
| 2015/0069620 A1* | 3/2015 | Chi | H01L 23/5226 257/774 |
| 2015/0091181 A1* | 4/2015 | Li | H01L 21/76897 257/774 |
| 2016/0027692 A1* | 1/2016 | Shieh | H01L 21/76879 438/586 |
| 2016/0181208 A1* | 6/2016 | Bao | H01L 23/562 257/774 |
| 2016/0211212 A1* | 7/2016 | Chao | H01L 23/5226 |
| 2017/0004991 A1 | 1/2017 | Pethe et al. | |
| 2017/0140930 A1 | 2/2017 | Kao et al. | |
| 2017/0110397 A1* | 4/2017 | Wu | H01L 21/02126 |
| 2017/0170113 A1 | 6/2017 | Edelstein et al. | |
| 2017/0263551 A1 | 9/2017 | Bristol et al. | |
| 2017/0263553 A1 | 9/2017 | Schenker et al. | |
| 2017/0278752 A1 | 9/2017 | Ryckaert et al. | |
| 2017/0301620 A1* | 10/2017 | Yang | H01L 23/53223 |
| 2017/0330761 A1 | 11/2017 | Chawla et al. | |
| 2018/0033690 A1* | 2/2018 | Yang | H01L 21/76883 |
| 2018/0061750 A1* | 3/2018 | Briggs | H01L 23/49827 |
| 2018/0204760 A1* | 7/2018 | Chandhok | H01L 21/76802 |
| 2018/0286749 A1* | 10/2018 | Zhang | H01L 23/5329 |
| 2018/0374750 A1* | 12/2018 | Zhang | H01J 37/00 |

(56) References Cited

U.S. PATENT DOCUMENTS

FOREIGN PATENT DOCUMENTS

| | | |
|---|---|---|
| TW | 201724183 A | 7/2017 |
| WO | WO2017111926 | 6/2017 |

* cited by examiner

INTERCONNECT STRUCTURE FOR SEMICONDUCTOR DEVICE AND METHODS OF FABRICATION THEREOF

PRIORITY DATA

The present application is a divisional application of U.S. application Ser. No. 15/692,439, filed Aug. 31, 2017 entitled "INTERCONNECT STRUCTURE FOR SEMICONDUCTOR DEVICE AND METHODS OF FABRICATION THEREOF", which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, multilayer interconnects (MLI) are used to connect various devices (transistors, resistors, capacitors, etc.) to form an IC. In a typical multilayer interconnect structure, conductive lines (e.g., copper wires) are laid in stacked dielectric layers and are connected through vias from one layer to another layer. The process takes aligning multiple conductive features to overlying and underlying layers. The alignment can be defined by patterns fabricated with lithography (or photolithography) processes. Sometimes, overlay errors between lithography processes may result in via misalignment with respect to the target conductive features. A misaligned conductive feature may cause accidental bridge (shorting) with a nearby conductive feature(s), creating IC defects; cause excessive etching of the underlying layer(s), creating IC reliability issues; or cause misalignment between desired interconnections of conductive features thereby creating a risk of an open. Such conductive feature (e.g., via-wire) misalignment issues become more problematic as the IC miniaturization continues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
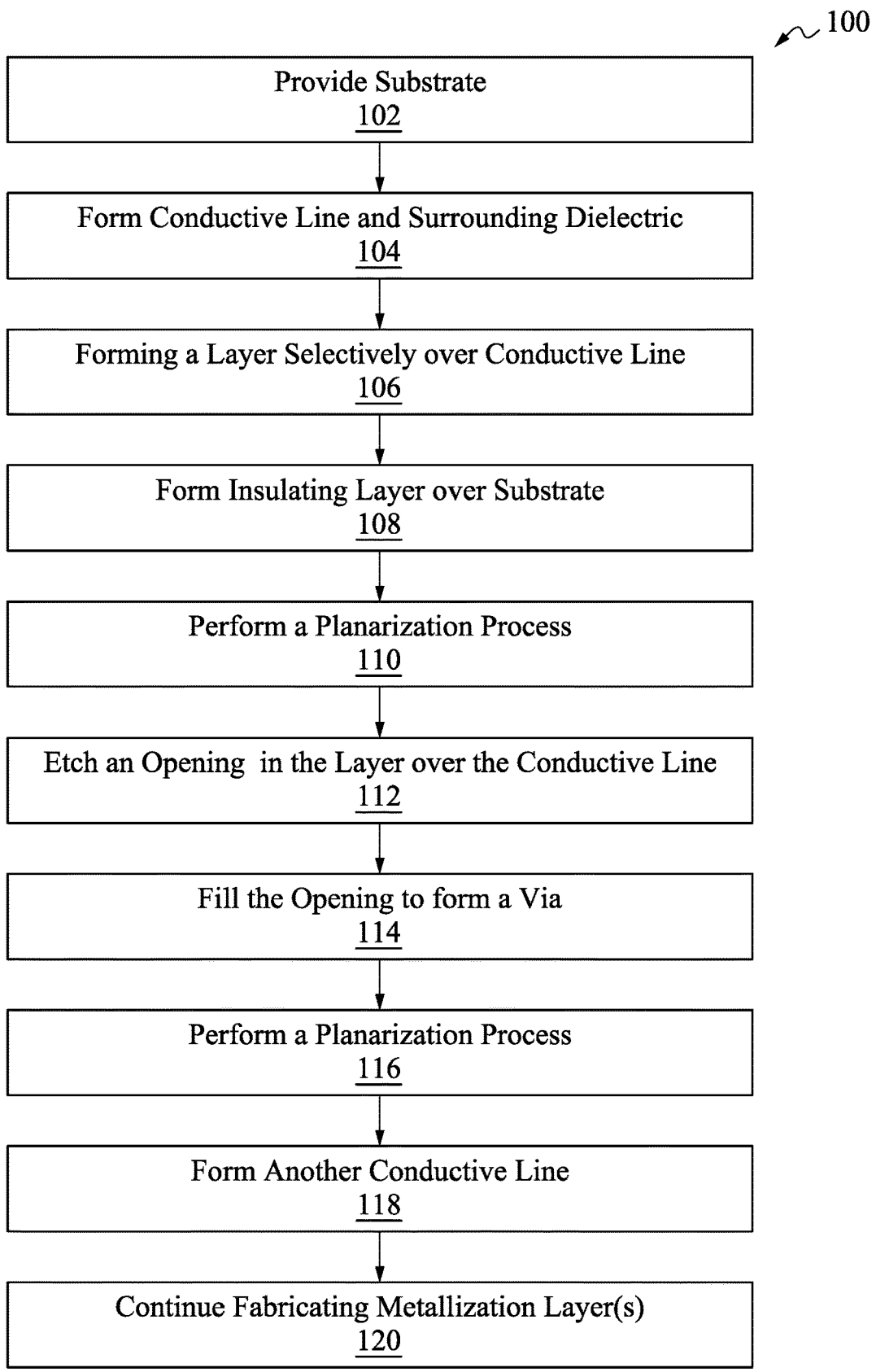
FIG. 1 is a flow chart illustrating an embodiment of a method of fabricating an IC with an interconnect according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices. More particularly, it is related to multilayer interconnect structures for integrated circuits (IC). However, it will be appreciated that other structures desiring an alignment between an underlying feature(s) and an underlying feature(s) may also benefit from aspects of the present disclosure.

FIG. 1 illustrates a flow chart of a method 100 of fabricating a semiconductor device according to one or more aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
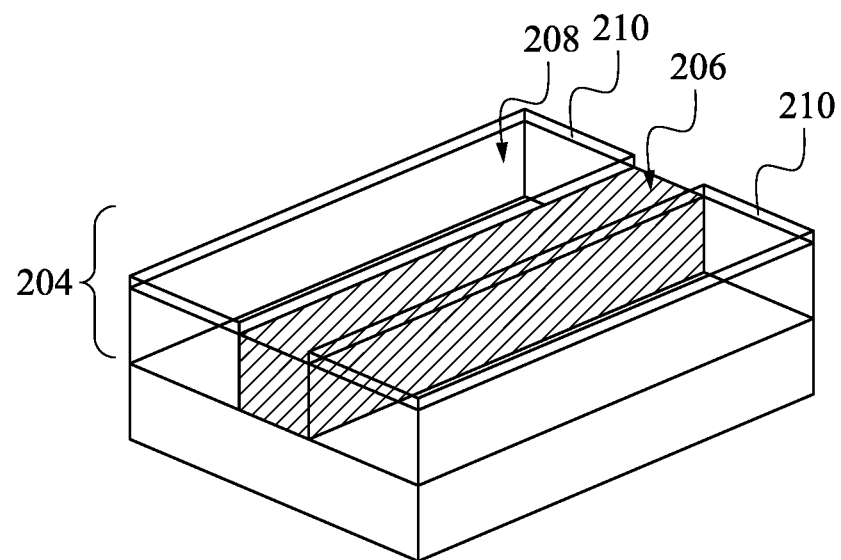
FIGS. 2A, 3A, 4A, 5A, 6A, 7A, 8A, 9A, and 10A show perspective views of an embodiment of a device at various processing stages of the method of FIG. 1.
Figure 2B:
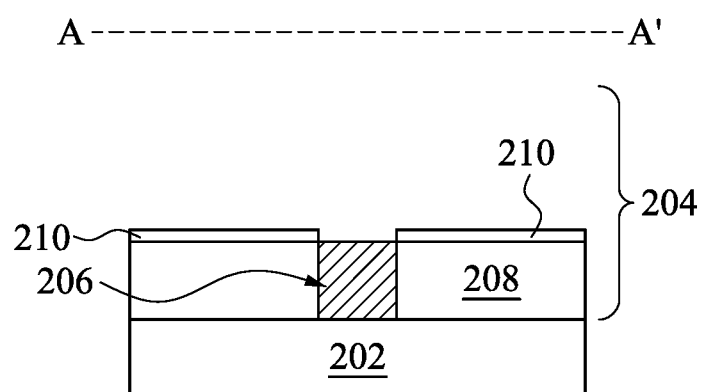
FIGS. 2B, 3B, 4B, 5B, 6B, 7B, 8B, 9B, 10B, and 10C show corresponding cross-sectional views of the embodiment of the device at various processing stages of the method of FIG. 1, in accordance with some embodiments.

The method 100 begins at block 102 where a substrate is provided. Exemplary FIG. 2A shows a perspective view of a semiconductor device 200, and FIG. 2B shows a cross-sectional view of the semiconductor device 200 along the "A-A'" line of FIG. 2A. Referring to the examples of FIGS. 2A and 2B, the semiconductor device 200 includes a substrate 202.

In embodiments, the substrate 202 includes a silicon substrate (e.g., a wafer). Alternatively, the substrate 202 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate 202 is a semiconductor on insulator (SOI). The substrate 202 includes active devices such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, and high frequency transistors. The transistors may be planar transistors or multi-gate transistors such as FinFETs. The substrate 202 may further include passive devices such as resistors, capacitors, and inductors. A portion of an MLI structure 204, discussed in further detail below, may be used to interconnect any one or more of these devices disposed on the substrate 202.

The method 100 then proceeds to block 104 where a conductive line is formed over the substrate. Referring to the example of FIGS. 2A and 2B, a conductive line 206 is illustrated. The conductive line 206 is a portion of the multilayer interconnect (MLI) structure 204. A MLI is an interconnected series of conductive lines and/or vias or contact structures with suitable insulating material surrounding portions thereof that provides interconnection to one or more devices disposed on the underlying substrate. It is noted that for the purpose of simplicity, the MLI structure 204 is shown to have a single layer with a conductive line (and a second layer with a conductive line discussed below). However, in various embodiments, the MLI structure 204 may comprise any number of (e.g., including greater than two) layers of conductive layers, such as five, seven, or even more layers in complex ICs. Each conductive layer may include any number of metal lines. In addition, the interconnect structure 204 may include one or more layers of conductive lines below the metallization layer including conductive line 206 illustrated. Further, conductive line 206 is connected via additional conductive lines or vias to one or more elements or devices disposed on the substrate 202.

The conductive line 206 may include a plurality of layers such as a barrier layer, adhesion layer, and/or metal layer. In some embodiments, the barrier or adhesion layer includes tantalum (Ta), tantalum nitride (TaN), titanium (Ti), titanium nitride (TiN), cobalt (Co), and/or other suitable conductive materials. In some embodiments, a copper layer is disposed over the barrier/adhesion layer. Other exemplary conductive materials that may be used for the conductive line 206 include aluminum (Al), tungsten (W), cobalt (Co), polysilicon, and/or other suitable conductors. In an embodiment, the conductive line 206 includes a barrier layer (e.g., Ta or TaN) and overlying conductive material of copper. In embodiments, the barrier layer includes one or more layers of material.

In an embodiment, the conductive line 206 is formed in an insulating layer 208. In some embodiments, the insulating layer 208 includes a low-K dielectric material. Exemplary materials for the insulating layer 208 include, but are not limited to, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

The insulating layer 208 may be deposited over the substrate 202 by a chemical vapor deposition (CVD) technique such as low-pressure CVD (LPCVD), plasma-enhanced CVD (PECVD), flowable CVD (FCVD), or other suitable deposition techniques. For example, the FCVD process includes depositing a flowable material (such as a liquid compound) over the substrate 202, and converting the flowable material to a solid material by a suitable technique, such as thermal annealing or ultra-violet radiation. The insulating layer 208 is then planarized by a CMP process or otherwise recessed to have a planar top surface. In some embodiments, subsequently, the insulating layer 208 is patterned with one or more lithography and etching processes to form trenches therein. The lithography process may include forming a photoresist (or resist) layer overlying the insulating layer 208, exposing the resist to a pattern, performing post-exposure bake processes, and developing the resist to form a masking element including the resist. The masking element is then used for etching trenches into the insulating layer 208. The etching process may include dry etching, wet etching, and/or other suitable processes. Thereafter, the conductive line 206 may be formed in the etched trenches. For example, the barrier/adhesion and/or metal layers used to form conductive line 206 may be deposited on the patterned insulating layer 208. In some embodiments, the conductive material(s) of the conductive line 206 may be deposited by one or more of suitable techniques such as sputtering, CVD, and electrolytic or electroless plating. After deposition, one or more of the conductive materials (e.g., barrier layer and the metal conductor layer) may overfill the trenches in the insulating layer 208 and thereafter, a CMP process may be performed to planarize the top surface of the device 200 to remove excessive barrier and metal materials over the insulating layer 208. The barrier and metal materials in the trenches remain, forming the conductive lines 206. As a result of the CMP process, in some embodiments the top surface of the insulating layer 208 and the top surface of the conductive lines 206 become substantially coplanar.

Figure 3A:
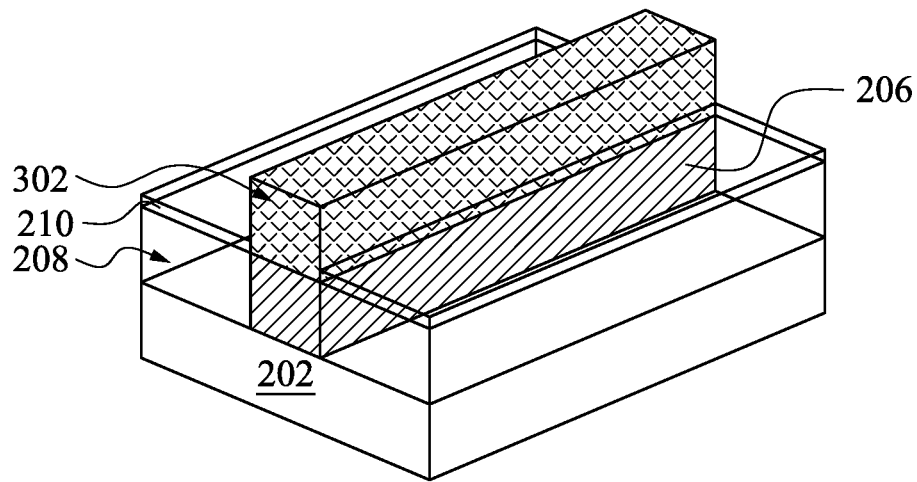
Figure 3B:
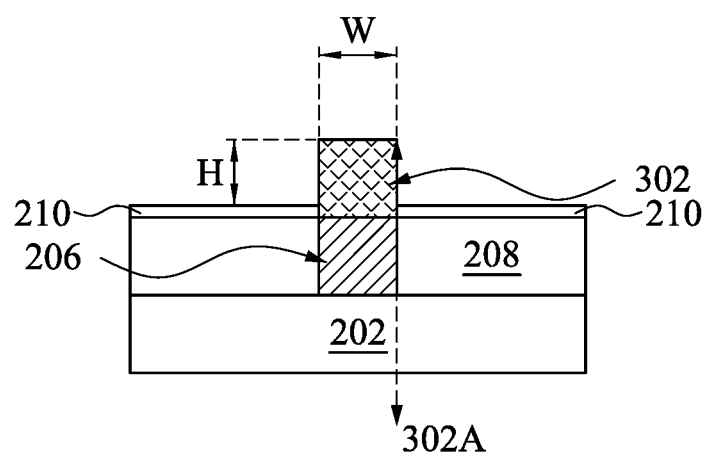

The method 100 then proceeds to block 106 where a first layer of material is deposited on the metal line. The first layer of material may be selectively deposited such that it is substantially covering the metal line. In some embodiments, the first layer of material is patterned to form a feature that substantially does not extend beyond terminus of the metal line. In other words, the first layer of material forms a feature vertically aligned above a metal line. The alignment of the first layer over the metal line 206 may be within the alignment tolerances of the fabrication process (e.g., within 10%). Referring to the example of FIGS. 3A and 3B, a first layer 302 is disposed over the substrate 202 and specifically over and aligned with the conductive line 206. The vertical alignment of the first layer 302 and the underlying conductive line 206 is illustrated as dashed line 302A in FIG. 3B.

In an embodiment, the first layer 302 is selectively grown on the conductive line 206. Selective growth includes growing (or depositing) the first layer 302 on the conductive line 206, while not growing (or depositing) material of the first layer 302 on surrounding layers such as the dielectric layer 208. In some embodiments, a nitride material is selectively grown to form the first layer 302.

In an embodiment, selective growth of the first layer 302 includes a pre-treatment step. In an embodiment, the pre-treatment step includes introducing a chemical to a surface of the device including a top surface of the conductive line 206 and a top surface of the dielectric layer 208. The introduction of the chemical provides for creating dangling bonds on a top surface of the dielectric layer 208. Exemplary chemicals for the pre-treatment step include aqueous acids such as diluted hydro-fluoride (HF and DI water). Exemplary chemicals for the pre-treatment step also include a mixture of chemicals in gaseous form, such as, for example, ammonia ($NH_3$) and $HF_3$.

In some embodiments, after pre-treatment the selective growth of the first layer 302 includes a treatment step. The treatment step may terminate the dangling bonds generated in the pre-treatment step. For example, the treatment may be performed to generate hydrophobic bonds with the now-dangling bonds (e.g., oxygen atoms) in dielectric layer 208 (e.g., oxygen present in the oxide material of the dielectric layer 208, including the exemplary compositions presented above). The process gas for the treatment step may include, for example, Bis(trimethylsilyl)amine, hexamethyldisilazane (HMDS), tetramethyldisilazane (TMDS), trimethylchlorosilane (TMCS), dimethyldichlorosilane (DMDCS), methyltrichlorosilane (MTCS), or the like.

In some embodiments, one or more of the exemplary process gasses provide for components suitable to attach to the dangling bonds of the dielectric layer 208 by a silylation process. The attachment to the oxygen atoms of the dielectric layer 208 may include C—H bonds, which may include $CH_3$ functional groups. For example, the attached bonds/material may include $Si(CH_3)_3$ in accordance with some embodiments.

The treatment step, because of the bonding discussed above, provides for an inhibitor film 210 formed on a top surface of the dielectric layer 208. The resulting inhibitor film 210 may be very thin, for example, the film 210 may only include some terminating bonds. It is noted that film 210 remains on the top surface of the dielectric layer 208 during and after the deposition of the overlying layer 402, discussed below.

After the pre-treatment step and the treatment step, each discussed above, the selective growth of material forming the first layer 302 may be performed. The material for the first layer 302 may include a dielectric material such as silicon nitride in accordance with some embodiments. In some embodiments, the selective growth is achieved by introducing process gases to the surface of the conductive line 206 and the inhibitor film 210. The process gases may include a silicon-containing precursor such as $SiBr_4$. In some embodiments, the process gases may be used to perform the selective growth at a temperature in the range between about 300° C. and about 400° C.

It is noted that in some embodiments, the selective growth of the first layer 302 provides advantages including the self-alignment of the first layer 302 with respect to the underlying conductive line 206. This self-alignment alleviates the need to perform patterning processes (including as discussed below) that require precise alignment between the first layer 302 and the underlying conductive line 206. It is noted that the first layer 310 may be selectively formed over each exposed metal line of the metallization layer including exemplary conductive line 206.

In some other embodiments, the material of the first layer 302 is deposited onto the substrate 202 using chemical vapor deposition (CVD) technique such as low-pressure CVD (LPCVD), plasma-enhanced CVD (PECVD), flowable CVD (FCVD), or other suitable deposition techniques. In an embodiment, the material of the first layer 302 as deposited is a blanket or conformal deposition across the substrate 202. In some embodiments, subsequently, the material of the first layer 302 is then patterned with one or more lithography and etching processes to form the feature over and aligned with the conductive line 206, illustrated as the feature of the first layer 302 in FIGS. 3A and 3B. The lithography process to pattern the first layer of material into feature(s) may include forming a photoresist (or resist) layer overlying a blanket deposition of the material of the first layer 302, exposing the resist to a pattern, performing post-exposure bake processes, and developing the resist to form a masking element including the resist. The masking element can define the feature of the first layer 302 such that it overlies and is aligned with the conductive line 206. The masking element in some embodiments is then used for etching the material removing it from over the insulating layer 208. The etching process may include dry etching, wet etching, and/or other suitable processes. It is noted that the first layer 310 may be formed over each metal line of the metallization layer. In some embodiments, the first layer includes features over each metal line to which an overlying via is to be connected. It is noted in methods using the lithography patterning such as discussed above, the inhibitor layer 210 is not formed.

The material of the first layer 302 is a dielectric material. In an embodiment, the first layer 302 is silicon nitride. Other exemplary dielectric materials for the first layer 302 include SiCN and SiCON. Any of silicon nitride, SiCN, SiCON, and/or other suitable compositions may be formed using the selective deposition process (e.g., pre-treatment, treatment, and selective growth) discussed above. It is noted that the composition of the first layer 302 is selected to provide an etch selectivity to the surrounding insulating layer 402, discussed below. In an embodiment, the etch selectivity to the first layer 302 is equal to or greater than approximately 50% with respect to the surrounding insulating layer 402.

The first layer 302 has a height H above the conductive line 206. In some embodiments, the height H is defined by the thickness of the material deposited to form the first layer 302. In some examples, the height H is between approximately 5 and 50 nanometers (nm). The height H is determined by the desired length (vertically extending) of the resultant via structure, discussed below. In some examples, the width W of the feature of the first layer 302 is approximately equal to the width of the conductive line 206. In some examples, the width W is between approximately 5 and 25 nm.

The method 100 then proceeds to block 108 where an insulating layer is formed on the substrate. The insulating layer is formed adjacent and abutting the first layer, discussed above with reference to block 106. The insulating layer may abut the sidewalls of the feature(s) of the first layer. Referring to the example of FIGS. 4A and 4B, an insulating layer 402 is formed on the substrate 202. The layers 208 and 402 may include the same or different dielectric material(s). In some embodiments, the insulating layer 402 and the insulating layer 208 are both oxide compositions. In some embodiments, the insulating layer 402 and the insulating layer 208 are the same composition, for example, the same oxide composition. In various embodiments, the insulating layer 402 includes a low-K dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

The insulating layer 402 may be formed using chemical vapor deposition (CVD) such as LPCVD, PECVD, and FCVD.

Figure 4A:
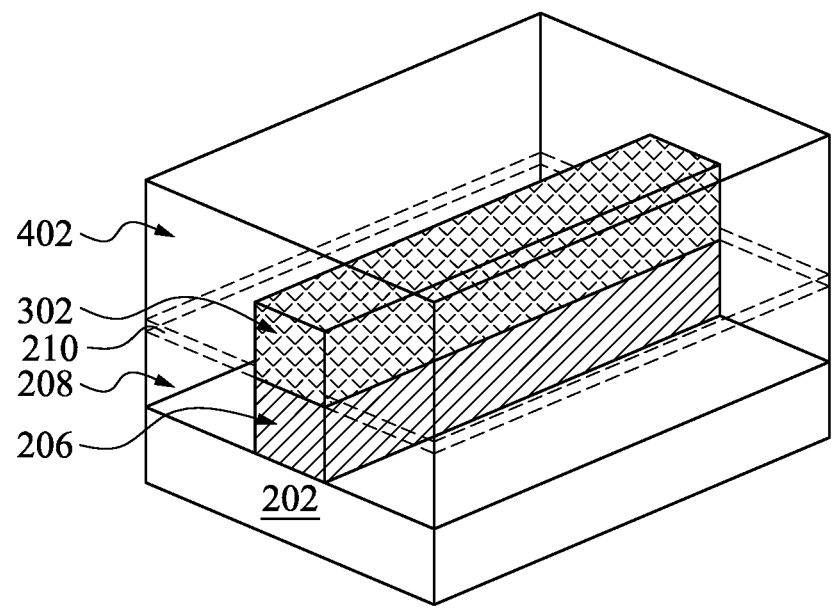
Figure 4B:
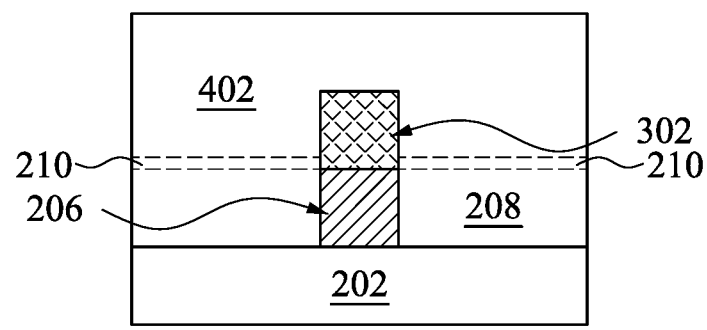
Figure 5A:
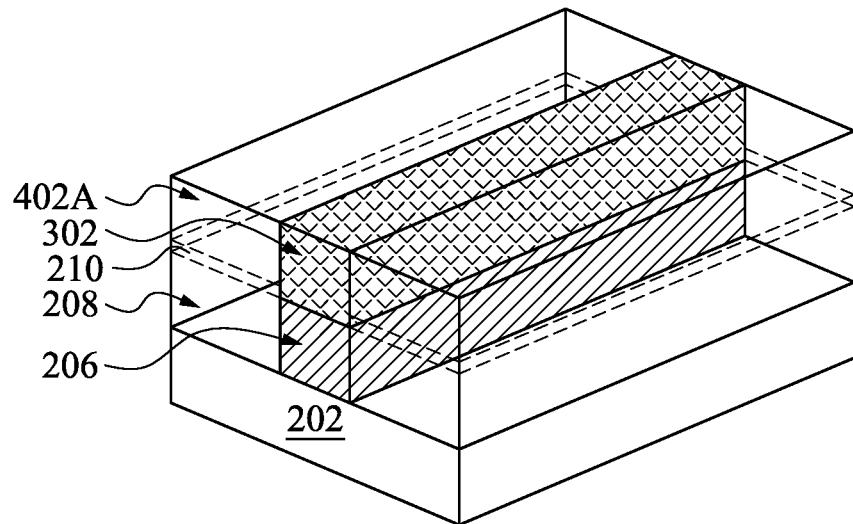
Figure 5B:
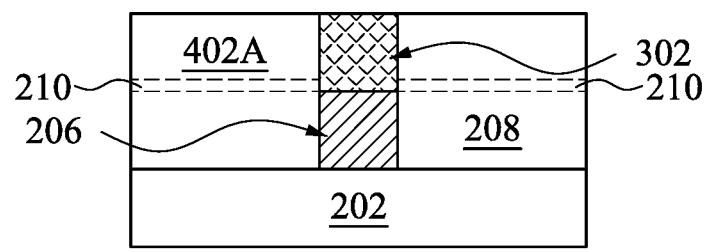

The method 100 then proceeds to block 110 where a planarization process such as a chemical mechanical polish (CMP) process is performed. As illustrated in the example of FIGS. 4A and 4B, in some embodiments, the insulating layer 402 is formed such that it is disposed over the first layer 302. Thereafter, as illustrated in block 110 and the examples of FIGS. 5A and 5B, the insulating layer 402 may be etched back to expose a top surface of the first layer 302, illustrated as insulating layer 402A. In some embodiments, the etching back is performed by a CMP process. As illustrated in the examples of FIGS. 5A and 5B, the insulating layer 402A has a top surface coplanar with a top surface of the first layer 302. Further, as illustrated, the insulating layer 402A may abut sidewalls of the first layer 302.

Figure 6A:
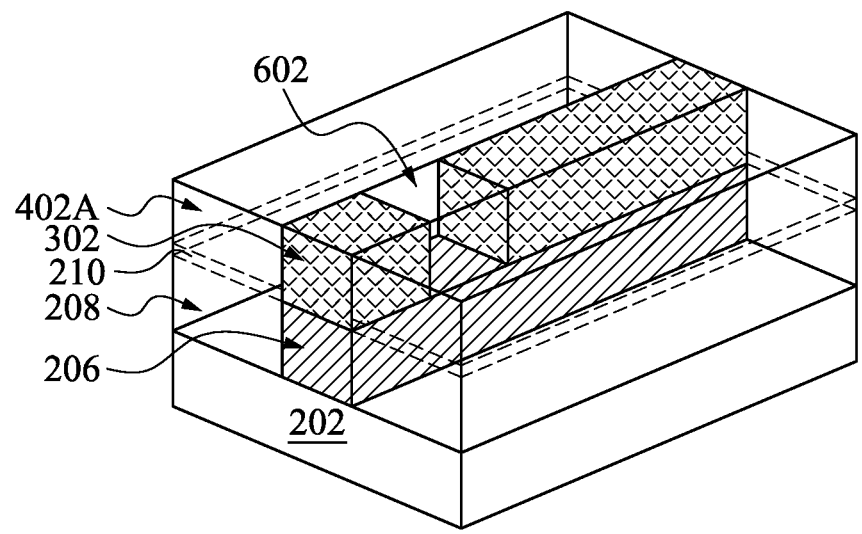
Figure 6B:
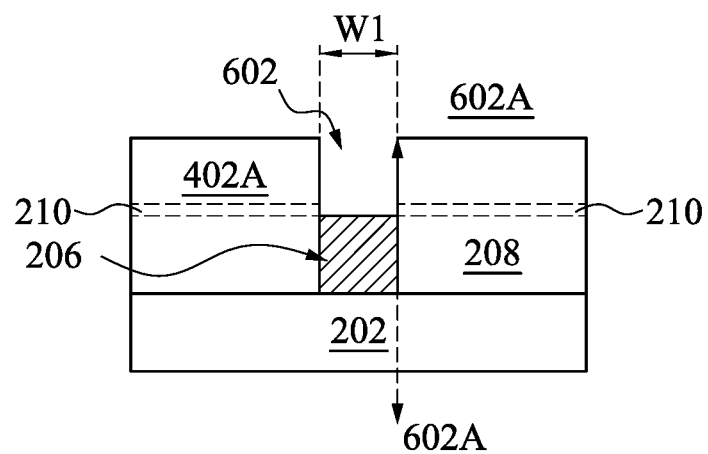

The method 100 then proceeds to block 112 where an opening is etched in the first layer over a portion of the conductive line. The opening may expose a top surface of the underlying conductive line. The opening may be defined by the dimensions of the desired via, which is subsequently formed within the opening, as discussed below. Referring to the examples of FIGS. 6A and 6B, an opening 602 is etched in the first layer 302. The opening 602 exposes a top surface of the conductive line 206. The opening 602 is also defined by sidewalls of the insulating layer 402A and the first layer 302. In an embodiment, the etching is one of wet etch, a dry etch, a plasma etch, or other suitable etching techniques. In some example, the etching is a fluorine based plasma etch is provided using etchant gases including $CH_3F$, $O_2$ and/or $CH_4$.

As discussed above, the composition of the insulating layer 402A is such that it is different than that of the first layer 302. Thus, in some embodiments, an etch selectivity is provided between the composition of the first layer 302 and the surrounding composition of the insulating layer 402A. Thus, the etch may be selective to the first layer 302 and confined such that the resultant opening 602 is vertically aligned with the conductive line 206, see vertical alignment illustrated by dashed line 602A in FIG. 6B. This can in some embodiments provide a beneficial self-alignment process between the opening 602 and the underling conductive line 206. In some examples the etch rate of the first layer 302 is at least 50% greater than that of surrounding layer(s).

The opening 602 may also be referred to as a via hole. The opening 602 has a width W1 that may be substantially the same as width W discussed above. In some embodiments, the opening 602 is formed by one or more lithography and etching processes (such as discussed above). The lithography process may include forming a resist layer overlying the insulating layer 402A, exposing the resist to a pattern defining the opening 302, performing post-exposure bake processes, and developing the resist to form a masking element including the resist. The masking element is then used for etching the openings into the insulating layer 402A until the conductive line 206 is exposed. The etching process is selective to the material of first layer 302 as discussed above. It is noted that in some embodiments, the overlay of the masking element defining the opening 602 may have a larger alignment window due to the etch selectivity provided by the first layer 302. For example, the opening defined by the masking element can be shifted left/right (see FIG. 6B) or providing a larger width opening in the photoresist masking element than the width W1 of the resulting opening 602 thereby exposing portions of the insulating layer 402A. This is because while the insulating layer 402A may be exposed by the masking element, the exposed portions of the insulating layer 402A are not etched due to the etching selectivity between the compositions of the insulating layer 402A and the first layer 302. Thus, certain embodiments provide for a greater margin in overlay between the masking element defining the opening and the conductive line 206.

Figure 7A:
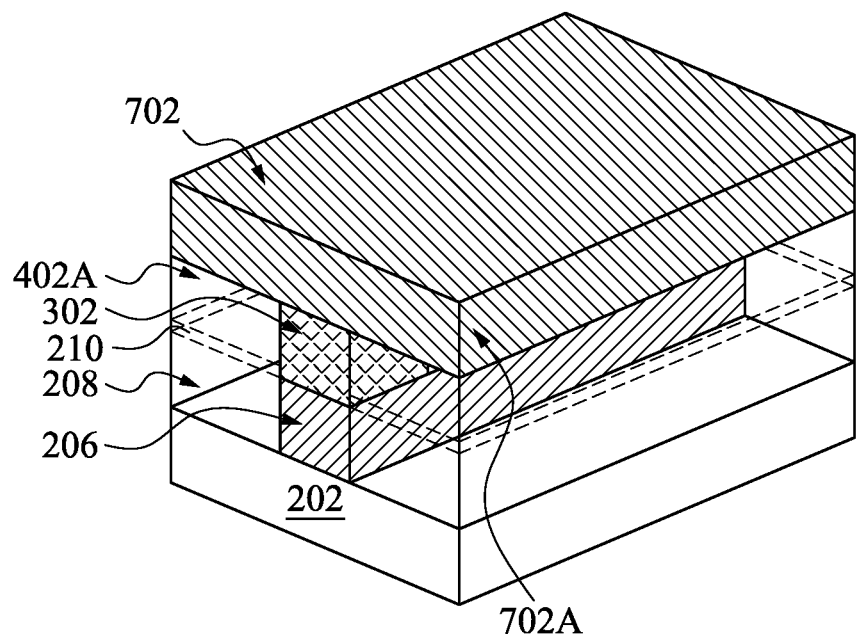
Figure 7B:
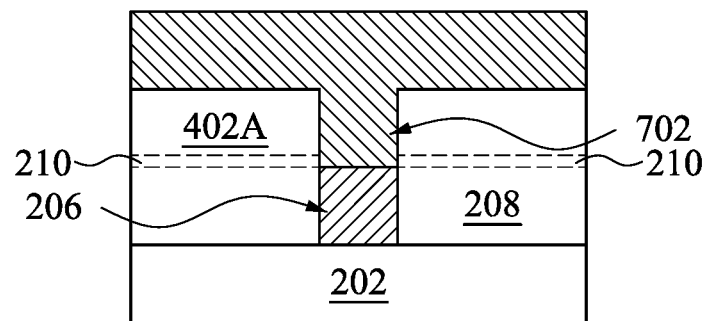

The method 100 then proceeds to block 114 where the opening is filled with a conductive material(s) to form a via. Referring to the example of FIGS. 7A and 7B, the opening 602 is filled with conductive material(s) 702. The conductive material(s) 702 may include a plurality of layers including, for example, barrier, adhesion, and overlying conductor layers. In some embodiments, the conductive material 702 includes the barrier layer(s) such as, for example, tantalum (Ta) or tantalum nitride (TaN). In some embodiments, the conductive material 702 include a metal conductor such as copper (Cu), aluminum (Al), tungsten (W), cobalt (Co), or other suitable metals. The barrier layers may be formed by CVD, physical vapor deposition (PVD), or ALD techniques; the metal conductor may be formed by sputtering, CVD, or electroplating techniques. The layer(s) of the conductive material 702 may overfill the opening 602 using the above deposition methods as illustrated in FIGS. 7A and 7B.

Figure 8A:
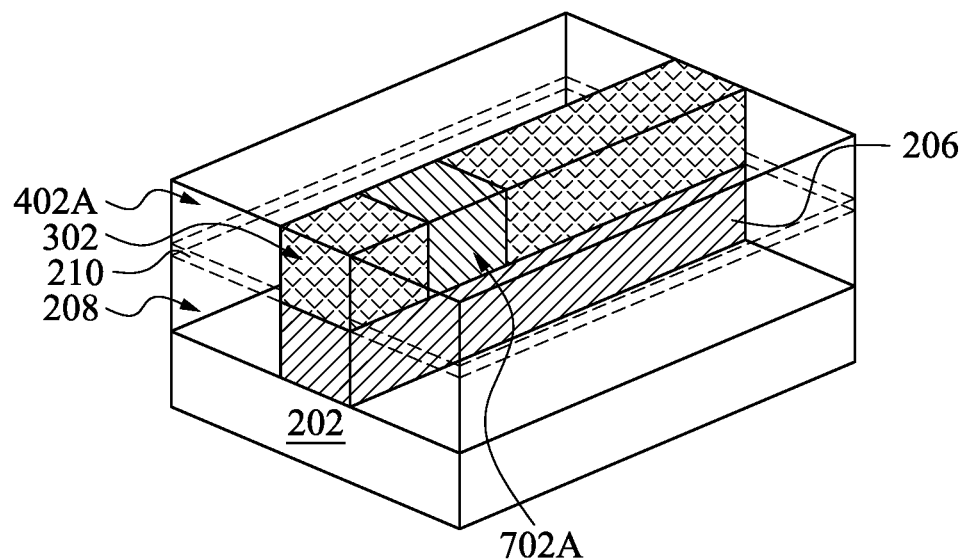
Figure 8B:
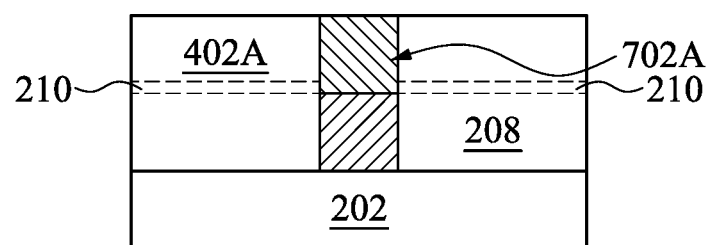

The method 100 then proceeds to block 116 where another planarization process is performed. In some embodiments, the planarization process includes a CMP process. The example of FIGS. 8A and 8B illustrate the device 200 after a subsequent planarization. Specifically, a planarization (e.g., CMP) process is performed to remove excessive conductive material deposited in block 114 and disposed over the top surface of the insulating layer 402A, leaving the remaining conductive layer(s) (e.g., barrier layer and metal conductor) filling the previous opening 602 and thus providing the via 702A. The via 702A may include one or more layers (e.g., a barrier and a metal conductor layer).

The method 100 then proceeds to block 118 where another conductive line is formed. The another conductive line may be formed substantially similar to as discussed above with reference to block 104. Referring to the example of FIGS. 9A, 9B, 10A, 10B, and 10C, a conductive material 902 is deposited to form conductive line 902A over and interfacing with the via 702A. An insulating layer 904 is disposed over the insulating layer 402A and abutting the conductive line 902A. The conductive line 902A may be substantially similar to the conductive line 206. In an embodiment, the conductive line 902A and the conductive line 206 include the same composition. In some embodiments, the conductive line 902A is in a conductive layer or metallization layer that is one level greater than the conductive layer or metallization layer of conductive line 206. For example, conductive line 902A may be disposed on Metal-2; conductive line 206 on Metal-1. The insulating layer 904 may be substantially similar to as discussed above with reference to the insulating layer 402A and/or the insulating layer 208. In an embodiment, two or more of the insulating layer 904, the insulating layer 402A, and the insulating layer 208 include the same composition.

The conductive material 902 and thus, the conductive line 902A may include a plurality of layers such as a barrier layer, adhesion layer, and/or metal layer. In some embodiments, the barrier or adhesion layer includes tantalum (Ta), tantalum nitride (TaN), titanium (Ti), titanium nitride (TiN), cobalt (Co), and/or other suitable conductive materials. In some embodiments, a copper layer is disposed over the barrier/adhesion layer. Other exemplary conductive materials that may be used for the conductive line 902A include aluminum (Al), tungsten (W), cobalt (Co), polysilicon, and/or other suitable conductors. In an embodiment, the conductive line 902A includes a barrier layer (e.g., Ta or TaN) and overlying conductive line of copper. In embodiments, the barrier layer includes one or more layers of material.

In an embodiment, the conductive line 902A is formed in the insulating layer 904. In some embodiments, the insulating layer 904 includes a low-K dielectric material. Exemplary materials for the insulating layer 904 include, but are not limited to, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

Figure 9A:
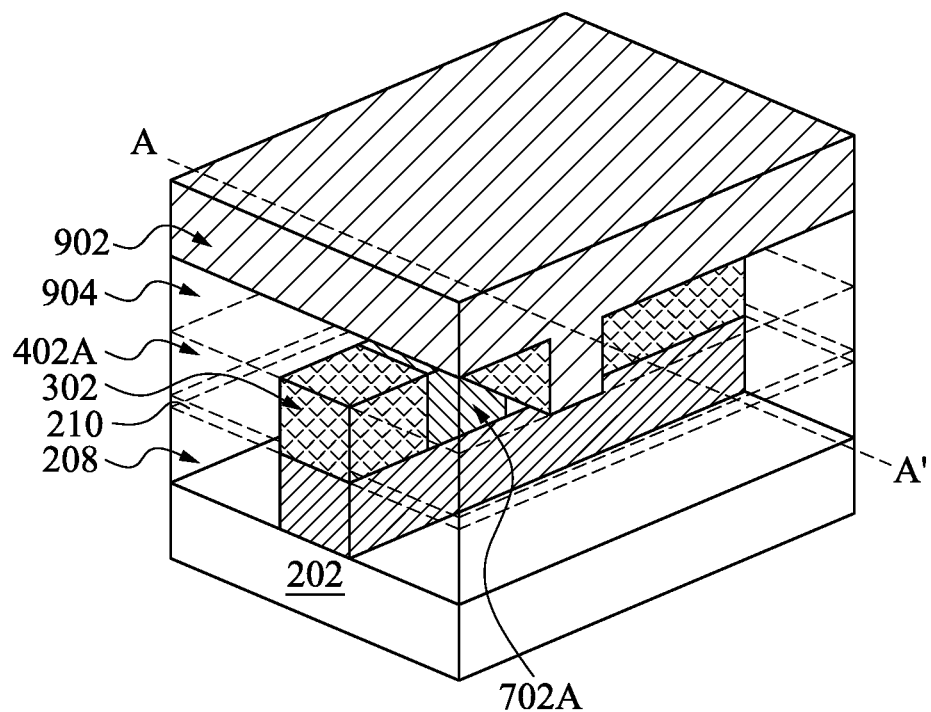
Figure 9B:
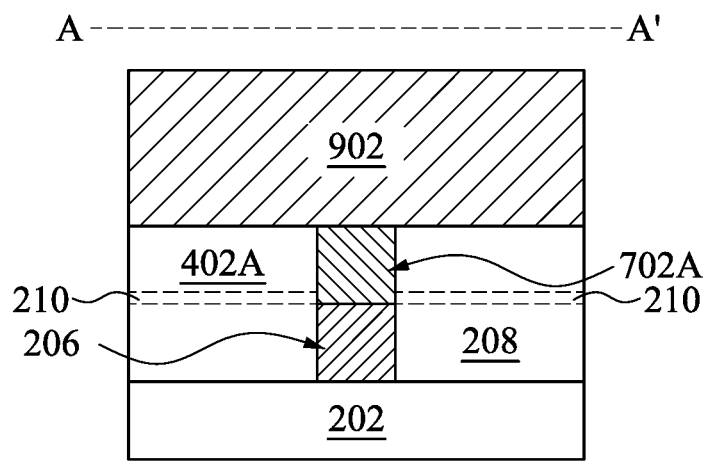

The insulating layer 904 may be deposited over the substrate 202 by a chemical vapor deposition (CVD) technique such as low-pressure CVD (LPCVD), plasma-enhanced CVD (PECVD), flowable CVD (FCVD), or other suitable deposition techniques. The insulating layer 904 may then be planarized by a CMP process or otherwise recessed to have a planar top surface. In some embodiments, subsequently, the insulating layer 904 is then patterned with one or more lithography and etching processes to form trenches therein. The lithography process may include forming a photoresist (or resist) layer overlying the insulating layer 904, exposing the resist to a pattern, performing post-exposure bake processes, and developing the resist to form a masking element including the resist. The masking element is then used for etching trenches into the insulating layer 904. The etching process may include dry etching, wet etching, and/or other suitable processes. Thereafter, material 902 to form the conductive line 902A may be formed in the etched trenches, as illustrated in FIGS. 9A and 9B. For example, the barrier/adhesion and/or metal materials 902 used to form conductive layer 902A may be deposited on the patterned insulating layer 904. In some embodiments, the conductive material(s) 902 may be deposited by one or more of suitable techniques such as sputtering, CVD, and electrolytic or electroless plating. After deposition, one or more of the conductive materials (e.g., barrier layer and the metal conductor layer) may overfill the trenches in the insulating layer 904 (see FIGS. 9A, 9B). Thereafter, a planarization process (e.g., CMP process) may be performed to planarize the top surface of the device 200 to remove excessive barrier and metal materials over the insulating layer 904, see the example of FIGS. 10A, 10B. The barrier and metal materials in the trenches remain forming the conductive line 902A. As a result of the planarization process, in some embodiments the top surface of the insulating layer 904 and the top surface of the conductive line 902A become substantially coplanar.

The conductive line 206, the via 702A and the conductive line 902A provide example conductive features of the MLI structure 204. The MLI structure 204 is disposed over the substrate 202 and connects the various active and/or passive devices in/over the substrate 202 to form an IC including device 200. In the embodiment as shown, the conductive line 206 may form a first layer metallization line (e.g., referred to as Metal-1) and the conductive line 902A provides a second layer metallization line (e.g., referred to as Metal-2), with the via 702A interconnecting the metallization lines. However, this is exemplary only and in other embodiments, the conductive lines 206 and 902A may form any metal layer of the MLI structure 204. Although not shown, the conductive lines 206/902A and via 702A are coupled to the active and/or passive devices in the substrate 202 through other underlying layers of the MLI structure 204 or through the terminals (e.g., source, drain, and gate contacts) of the active and/or passive devices.

Figure 10A:
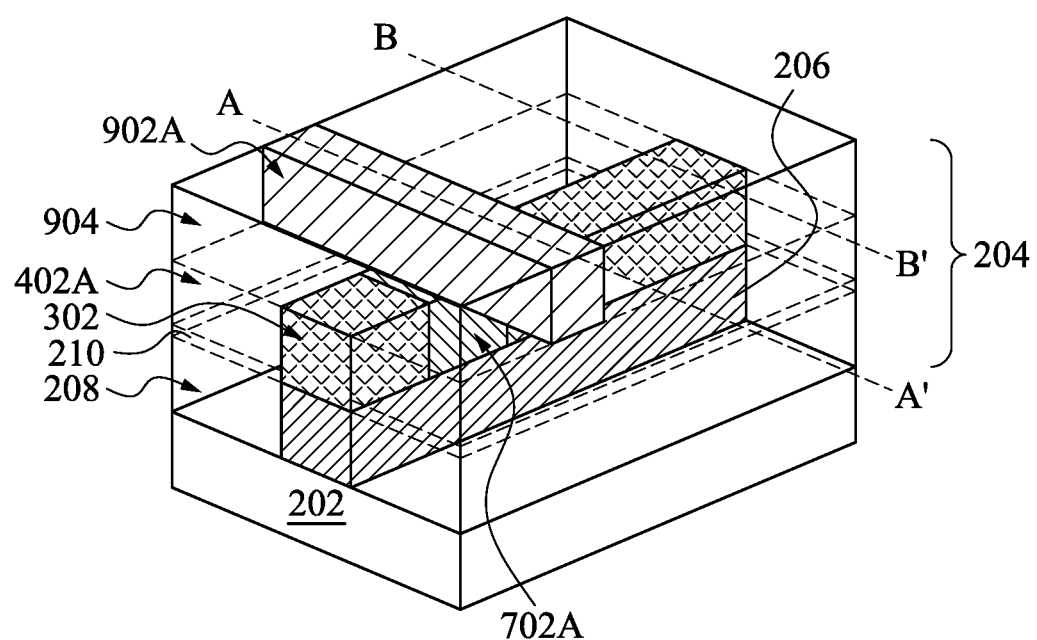
Figure 10B:
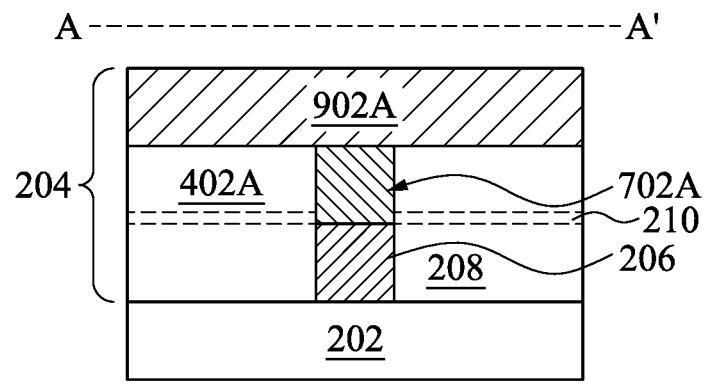
Figure 10C:
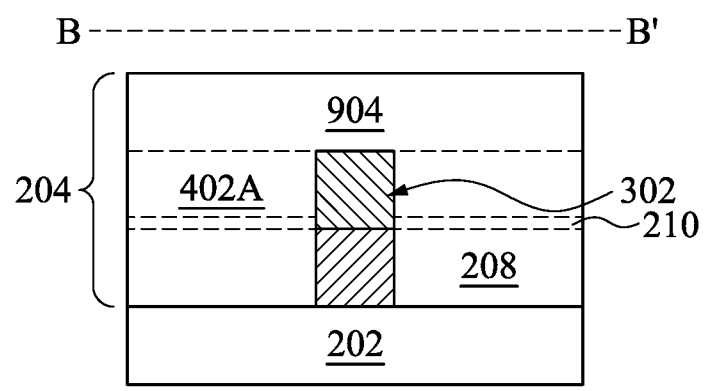

It is noted that FIG. 10C illustrates the conductive line 206 at cross-section B-B', or displaced from an overlying via connection. The first layer 302 is disposed over the conductive line 206 and surrounded with insulating layers 904, 402A and 208. In some embodiments, the compositions of layers 904, 402A, and/or 208 are oxide and the composition of first layer 302 is a nitride. As such, the first layer 302 is a different composition that one or more of layers 904, 402A, and/or 208. In some embodiments, the first layer 302 directly interfaces the top surface of the conductive line 206.

The method 100 then proceeds to block 120 where additional fabrication processes may be performed. In an embodiment, additional back-end-of-the-line (BOEL) processes are performed such as formation of additional metallization layers and interposing dielectric layers, e.g., additional features of the MLI structure.

One or more the processes above illustrate the formation of the via 702A and the overlying metallization layer 902A using a damascene process. Other processes, including dual damascene processes may also be implemented using the method 100.

Figure 11:
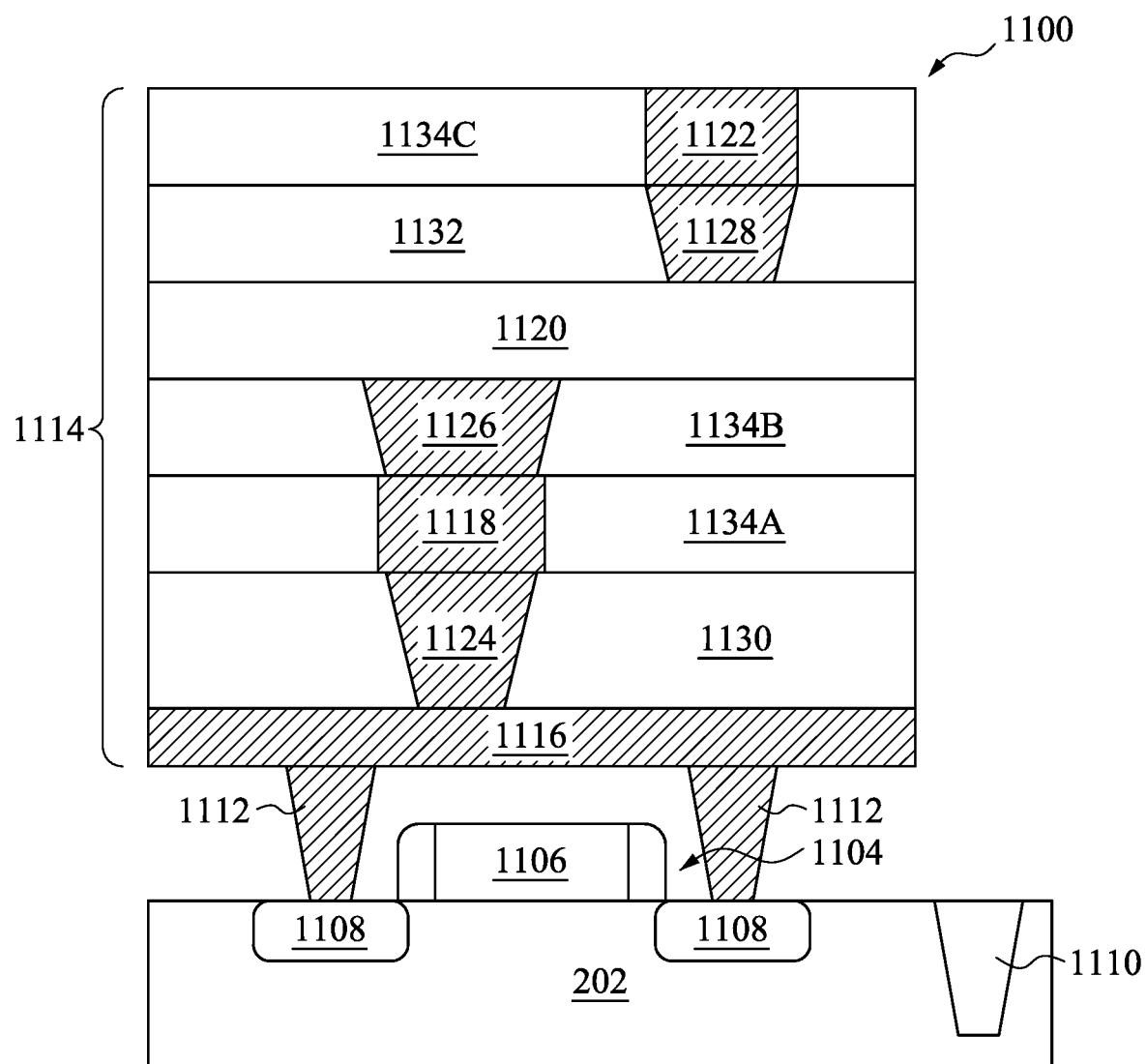
FIG. 11 illustrates a cross-sectional view of an embodiment of a semiconductor device, in accordance with some embodiments.

Referring now to FIG. 11, illustrated is a device 1102 that may be fabricated using one or more steps of the method 100. The device 1102 includes a substrate 202, which may be substantially similar to as discussed above with reference to block 102 of the method 100. An active device 1104 is fabricated on the substrate 202. The active device 1104 is, in the exemplary embodiment, a transistor having a gate structure 1106 and source/drain structures 1108. In an embodiment, the active device 1104 is a FinFET device disposed on an active region extending from the substrate 202. The active device 1104 is disposed on an active region of the substrate 202, an isolation feature 1110 disposed adjacent thereto. The isolation feature 1110 may be a shallow trench isolation (STI) feature.

The gate structure 1106 may include a gate dielectric layer and a gate electrode. It is understood that the gate structure 1106 may comprise additional layers such as interfacial layers, capping layers, diffusion/barrier layers, work function layers, and other suitable layers. In some embodiments, the gate dielectric layer is a high-k gate dielectric. Examples of high-k dielectric material includes HfO2, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some embodiments, the gate structure includes a polysilicon gate electrode. In some embodiments, the gate structure includes a metal gate electrode. The gate electrode layer may includes any suitable material, such as polysilicon, aluminum, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof. In some embodiments, gate spacers are included in the gate structure. The gate spacer may be a multi-layer dielectric used to offset subsequently formed doped regions, such as source/drain regions. The gate spacers may further be used for designing or modifying the source/drain region (junction) profile.

The source/drain structures 1108 may include semiconductor material suitably doped to provide the active device 1104. In some embodiments, the source/drain structures 1108 are epitaxially grown features doped with n-type or p-type dopants.

Contact structures 1112 may extend from one or more of the gate structure 1106 and the source/drain structures 1108. Contact structures 1112 may be tungsten or other suitable conductive materials.

A multilayer interconnect (MLI) structure 1114 is disposed over the active device 1104 and provides interconnection to the active device 1104. The MLI structure 1114 includes a first metallization layer (Metal-1) 1116, a second metallization layer (Metal-2) 1118, a third metallization layer (Metal-3) 1120, and a fourth metallization layer (Metal-4) 1122. However, four metallization layers are provided for illustrative purposes only and the MLI structure 1114 may include any number of metallization layers.

Each of metallization layers 1116, 1118, 1120, and/or 1122 may include a multi-layer structure, such as including a liner or barrier layer and an overlying metallization layer. In some embodiments, metallization layers 1116, 1118, 1120, and/or 1122 include a barrier layer of Ti or Ta or a nitride thereof, and an overlying conductive material such as copper. In some embodiments, the metallization layers 1116, 1118, 1120, and/or 1122 include materials such as titanium (Ti), tantalum (Ta), nitrides of metals including Ti and Ta, copper (Cu), aluminum (Al), tungsten (W), cobalt (Co), or other suitable metals. The metallization layer 1116 interfaces the contact structures 1112. It is noted that a plurality of layers may interpose the metallization layer 116 and the active device 1104 including an interlayer dielectric layer (ILD) layer, a contact etch stop layer (CESL), silicide features providing for contact between the source/drain structures 1108 or gate structure 1106 and an overlying contact structure 1112 and/or other features known in the art.

Via structures 1124, 1126, and 1128 provide a vertical interconnection between the respective metallization layers 1116, 1118, 1120 and 1122. The via structures 1124, 1126, and/or 1128 may be substantially similar to the via 702A, discussed above with reference to the method 100. In some embodiments, the via structures 1124, 1126, and 1128 include materials such as titanium (Ti), tantalum (Ta), nitrides of metals including Ti and Ta, copper (Cu), aluminum (Al), tungsten (W), cobalt (Co), or other suitable metals. Via structures 1124, 1126, and 1128 may also be multi-layer features.

The MLI 1114 also includes a plurality of dielectric or insulating layers including those referred to interlayer dielectric (ILD) layers. The MLI 1114 includes a layer 1130, which may be substantially similar to the first layer 302, discussed above with reference to the method 100 of FIG. 1. In an embodiment, the layer 1130 is a dielectric layer. In an embodiment, the layer 1130 has a different composition than the adjacent and coplanar ILD layer (not shown) of the MLI 1114. The layer 1130 may be disposed on the metallization layer 1116 such that it is substantially vertically aligned over the metallization layer 1116. For example, a terminus edge of the layer 1130 may be substantially coplanar (vertically) with a terminus edge of the metallization layer 1116. The layer 1130 may extend the width of the metallization layer 1116. The via 1124 extends through the thickness (or height) of the layer 1130.

The MLI 1114 also includes a layer 1132, which may also be substantially similar to the first layer 302, discussed above with reference to the method 100 of FIG. 1. In an embodiment, the layer 1132 is a dielectric layer. In an embodiment, the layer 1132 has a different composition than the adjacent and coplanar ILD layer (not shown) of the MLI 1114. The layer 1132 may be disposed on the metallization layer 1120 such that it is substantially vertically aligned over the metallization layer 1120. For example, a terminus edge(s) of the layer 1132 may be substantially coplanar (vertically) with a terminus edge(s) of the metallization layer 1120. The layer 1132 may extend the width of the metallization layer 1120. The via 1128 extends through the thickness (or height) of the layer 1132.

The MLI 1114 also includes the insulating layer 1134A, 1134B, and 1134C. The insulating layers 1134A, 1134B, and/or 1134C may be substantially similar to insulating layer 208, insulating layer 402A and/or insulating layer 904, described above with reference to the method 100 of FIG. 1. The insulating layer 1134A, 1134B, and/or 1134C may include a low-K dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The insulating layer 1134A, 1134B, and/or 1134C include a composition that is different than the layers 1130 and/or 1132. Specifically, the compositions of insulating layer 1134A, 1134B, and 1134C has an etch selectivity with respect to the layers 1130 and/or 1132. In some embodiments, one or more of the insulating layer 1134A, 1134B, and 1134C are an oxide and the layers 1130 and/or 1132 are a nitride. It is noted that insulating layers 1134A, 1134B, and 1134C are exemplary only and additional ILD layers of the MLI 1114 are also present in the device 1100. Specifically, as illustrated above, coplanar with each of the layers 1130 and 1132 there is a respective ILD layer (i.e., in those regions of the metallization layer that is not over a conductive line such as line 1116).

It is noted that the device 1100 is shown in cross-section at an exemplary point in the MLI 1114. In other cross-sectional points of the device 1100, a layer substantially similar to 1130 and/or 1132 is laterally (e.g., horizontally) coplanar with the via 1124 and 1128. Similarly, in other cross-sectional points of the device 1100, a layer substantially similar to the insulating layer 1134A, 1134B, and/or 1134C is laterally (e.g., horizontally) coplanar with the via 1126.

Although not intended to be limiting, one or more embodiments of the present disclosure provide many benefits to a semiconductor device and the formation thereof. For example, embodiments of the present disclosure provide a first layer over conductive lines in a multilayer interconnect structure. The first layer limits adverse etching of the surrounding and/or underlying dielectric layer such as when there are misalignments in defining the via opening due to overlay errors. Certain embodiments thus, allow for an enlarged via critical dimension overlay window. The etch selectivity of the material of the first layer (e.g., in comparison with the surrounding dielectric/insulating layers) can provide for a self-alignment process that can be integrated with a BEOL metallization process as illustrated with reference to the method 100. One or more these benefits can also lead to improved device performance such as lower contact resistance because of a larger contact area between metallization features (e.g., via and underlying metallization layer).

In one exemplary aspect, the present disclosure is directed to a device including a conductive line disposed over a substrate; a first dielectric layer disposed over the substrate and coplanar with the conductive line; a second dielectric layer disposed over the conductive line and a third dielectric layer disposed over the first dielectric layer; and a via extending through the second dielectric layer and coupled to the conductive line. The second dielectric layer and the third dielectric layer are coplanar and the second and third dielectric layers have a different composition.

In an embodiment, a first sidewall of the via interfaces the second dielectric layer and a second sidewall of the via interfaces the third dielectric layer. In a further embodiment, a bottom surface of the via interfaces the conductive line and a top surface of the via interfaces another conductive line. In an embodiment, the second dielectric layer is a nitride and the third dielectric layer is an oxide. In an embodiment, the first dielectric layer and the third dielectric layer have a same composition. In an embodiment, the second dielectric layer is silicon nitride.

In another of the broader embodiments presented herein a method includes forming a conductive feature in a first dielectric layer disposed over a substrate and forming a second dielectric layer on the conductive feature and a third dielectric over the first dielectric layer. The second dielectric layer and the third dielectric layer have different compositions. A via opening is etched in the patterned second dielectric layer exposing the conductive feature. The via opening is filled with a conductive material.

In some embodiments of the method forming the second dielectric layer includes selectively growing a material on the conductive feature. In some embodiments, forming the second dielectric layer includes a first composition including silicon and nitrogen and forming the third dielectric layer includes a second compositing including silicon and oxygen. In an further embodiment, selectively growing the material includes forming an inhibitor layer on a top surface of the first dielectric layer. In an embodiment, the second dielectric layer and the third dielectric layer are planarized prior to the etching the via opening. In an embodiment, the second dielectric layer has a terminal edge being vertically aligned over a terminal edge of the conductive feature. In some embodiments, filling the via opening includes depositing a barrier layer and the conductive material over the barrier layer. In an embodiment, forming the second dielectric layer includes selectively growing silicon nitride on the conductive feature. In an embodiment, filling the via opening includes performing a planarization process after depositing the conductive material.

In another of the broader embodiments provided herein a method is provided that includes forming a first layer of a multi-layer interconnect (MLI) structure. The first layer includes a first metal line and a first dielectric. A second dielectric layer is formed over the first metal line and a third dielectric layer over the first dielectric. An opening is selectively etched in the second dielectric layer to expose the first metal line. A conductive via is formed in the opening. A second layer of the MLI structure (which includes a second metal line) is then formed. The conductive via interconnects the second metal line and the first metal line.

In a further embodiment, selectively etching the opening in the second dielectric layer includes performing an etching process that etches the second dielectric layer with at least 50% greater selectivity that the third dielectric layer. In an embodiment, the second dielectric layer is vertically aligned with the first metal layer. In an embodiment, forming the second dielectric layer and the third dielectric layer includes [1] treating the first dielectric; [2] selectively growing the second dielectric layer on the first metal line; [3] after the selective growing, depositing a second material to form the third dielectric layer on the treated first dielectric. The treating the first dielectric inhibits growth of the second dielectric layer over the first dielectric. In a further embodiment, the second material and the feature are planarized.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a conductive line disposed over a substrate;
   a first dielectric layer disposed over the substrate and coplanar with the conductive line;
   a second dielectric layer disposed over the conductive line; and
   a third dielectric layer disposed over the first dielectric layer, wherein the second dielectric layer and the third dielectric layer are coplanar and the second and third dielectric layers have a different composition;
   an inhibitor film formed on a top surface of the first dielectric layer and under the third dielectric layer; and
   a via extending through the second dielectric layer and coupled to the conductive line, wherein the via includes a first sidewall interfacing the second dielectric layer, a second sidewall opposing the first sidewall and interfacing the second dielectric layer, a third sidewall extending between the first and second sidewalls and interfacing the third dielectric layer, and a fourth sidewall opposing the third sidewall.

2. The device of claim 1, wherein the fourth sidewall of the via interfaces the third dielectric layer.

3. The device of claim 2, wherein a bottom surface of the via interfaces the conductive line and a top surface of the via interfaces another conductive line, and wherein a portion of third sidewall interfaces the inhibitor film.

4. The device of claim 1, wherein the second dielectric layer is a nitride and the third dielectric layer is an oxide.

5. The device of claim 1, wherein the first dielectric layer and the third dielectric layer have a same composition.

6. The device of claim 1, wherein the second dielectric layer is silicon nitride.

7. A device comprising:
   a conductive line in a first dielectric layer disposed over a substrate, the conductive line having a length greater than a width, the length extending in a first direction;
   a second dielectric layer interfacing the conductive line and a third dielectric layer over the first dielectric layer, wherein the second dielectric layer and the third dielectric layer have different compositions and are coplanar, wherein the second dielectric layer extends along the length of the conductive line and extends along the width of the conductive line; and
   an inhibitor layer disposed between the third dielectric layer and the first dielectric layer, wherein the second dielectric layer and the third dielectric layer have coplanar top surfaces;
   a conductive via above the conductive line and extending to a top surface of the conductive line, wherein the conductive via extends from a first edge having first physical interface with the second dielectric layer to a second edge having a second physical interface with the second dielectric layer, and the conductive via extends from a third edge having a third physical interface with the third dielectric layer to a fourth edge having a fourth physical interface with the third dielectric layer.

8. The device of claim 7, wherein the second dielectric layer includes silicon and nitrogen and wherein the third dielectric layer includes silicon and oxygen.

9. The device of claim 7, wherein the first dielectric layer and the conductive line feature have coplanar top surfaces.

10. The device of claim 7, wherein the second dielectric layer is silicon nitride.

11. The device of claim 7, wherein the second dielectric layer has a terminal edge interfacing the first edge of the conductive via, wherein the second dielectric terminal edge is vertically aligned over a terminal edge of the conductive line.

12. The device of claim 11, wherein the third dielectric layer interfaces the terminal edge of the second dielectric layer.

13. The device of claim 7, further comprising: another conductive line disposed over and interfacing with the conductive via, wherein the another conductive line interfaces the third dielectric layer.

14. The device of claim 7, wherein the conductive via includes a barrier layer and a conductive material over the barrier layer.

15. A device, comprising:
- a first conductive line disposed over a substrate;
- a first dielectric layer disposed over the substrate and interfacing a sidewall of the first conductive line;
- an inhibitor layer over the first dielectric layer;
- a second dielectric layer disposed over and interfacing a top surface of the first conductive line, wherein the second dielectric layer has a first sidewall and a second sidewall opposing the first sidewall, and a third sidewall extending between the first sidewall and the second sidewall;
- a third dielectric layer disposed over the inhibitor layer and the first dielectric layer, wherein a first portion of the third dielectric layer interfaces the first sidewall of the second dielectric layer and a second portion of the third dielectric layer interfaces the second sidewall of the second dielectric layer;
- a via interfacing the third sidewall of the second dielectric layer, interfacing the third dielectric layer, extending through the second dielectric layer, and coupled to the first conductive line; and
- a second conductive line over and interfacing the via and the third dielectric layer, wherein the second conductive line does not interface the second dielectric layer.

16. The device of claim 15, wherein the first sidewall of the second dielectric layer is collinear with a first sidewall of the conductive line and the second sidewall of the second dielectric layer is collinear with a second sidewall of the conductive line.

17. The device of claim 16, wherein the first dielectric layer interfaces each of the first and second sidewalls of the conductive line.

18. The device of claim 16, wherein the third dielectric layer directly interfaces the first dielectric layer.

19. The device of claim 16, wherein the via includes lateral sidewalls interfacing each of the third sidewall of the second dielectric layer and the third dielectric layer.

* * * * *